(12) United States Patent
Sting et al.

(10) Patent No.: US 11,322,678 B1
(45) Date of Patent: *May 3, 2022

(54) MOUNTING PAD AND METHOD FOR DETERRING THEFT AND SECURING AIR CONDITIONING UNITS AGAINST HIGH WINDS

(71) Applicant: Mainstream Engineering Corporation, Rockledge, FL (US)

(72) Inventors: Elliott M. Sting, Orlando, FL (US); Robert P. Scaringe, Rockledge, FL (US)

(73) Assignee: Mainstream Engineering Corporation, Rockledge, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/680,604

(22) Filed: Nov. 12, 2019

Related U.S. Application Data

(63) Continuation of application No. 15/685,283, filed on Aug. 24, 2017, now Pat. No. 10,559,742.

(51) Int. Cl.
| | |
|---|---|
| *H01L 41/273* | (2013.01) |
| *H01L 31/18* | (2006.01) |
| *H01L 21/477* | (2006.01) |
| *H01J 37/305* | (2006.01) |

(52) U.S. Cl.
CPC ......... *H01L 41/273* (2013.01); *H01J 37/305* (2013.01); *H01L 21/477* (2013.01); *H01L 31/18* (2013.01)

(58) Field of Classification Search
USPC ....... 248/545, 678, 679, 156, 346.01, 346.2, 248/346.03, 346.06, 346.5, 499, 507, 508; 220/475, 630, 636, 601; 108/56.1, 901, 108/57.25, 902, 51.11, 53.3, 57.28
See application file for complete search history.

(56) References Cited

U.S. PATENT DOCUMENTS

| | | | | |
|---|---|---|---|---|
| 2,315,196 A | * | 3/1943 | Gallione | ................ B65D 19/44 248/499 |
| 2,696,360 A | * | 12/1954 | Toffolon | ................ B65D 19/44 206/597 |
| 2,739,776 A | * | 3/1956 | Terando | ............. B65D 19/0002 108/54.1 |
| 3,478,995 A | * | 11/1969 | Lautzenhiser | ....... B61D 45/002 410/104 |

(Continued)

*Primary Examiner* — Eret C Mcnichols
*Assistant Examiner* — Michael McDuffie
(74) *Attorney, Agent, or Firm* — Michael W. O'Neill, Esq.

(57) ABSTRACT

A mounting pad system and method for an HVAC outdoor unit that includes providing a lightweight fillable pad shell containing a gelling material and having securing slots extending from an underside surface to an upperside surface of the shell. The shell is filled with water through a port at its upper surface. Prior to leveling the filled pad on the soil at the site and installation of the outdoor unit, securing straps are inserted into the slots from the underside surface of the shell so as to extend through an upper surface thereof. The filling port is covered when the HVAC unit is placed on top of the pad. One or more securing anchors can be used to anchor the pad to the ground, which are also covered when the HVAC unit is place on top of the pad and an anti-theft cable can be employed to further prevent theft.

5 Claims, 10 Drawing Sheets

(56) References Cited

U.S. PATENT DOCUMENTS

| | | | |
|---|---|---|---|
| 3,493,201 A | 2/1970 | Marran | |
| 3,713,620 A | 1/1973 | Tkach | |
| 3,722,845 A | 3/1973 | Unger | |
| 3,841,032 A | 10/1974 | Grannis, III | |
| 3,877,671 A * | 4/1975 | Underwood | B61D 45/002 |
| | | | 248/346.03 |
| 4,008,669 A * | 2/1977 | Sumrell | B60P 7/12 |
| | | | 410/47 |
| 4,606,524 A | 8/1986 | Conee | |
| 4,829,909 A | 5/1989 | Mandel | |
| 5,350,147 A | 9/1994 | Paganus | |
| 5,358,137 A * | 10/1994 | Shuert | B65D 77/0466 |
| | | | 206/600 |
| 5,772,369 A * | 6/1998 | Lerman | B65B 11/025 |
| | | | 108/55.5 |
| 5,887,529 A * | 3/1999 | John | B65D 19/0069 |
| | | | 108/56.1 |
| 5,961,093 A | 10/1999 | Jones | |
| 5,979,844 A * | 11/1999 | Hopkins | E01F 13/02 |
| | | | 248/158 |
| 6,065,916 A * | 5/2000 | Swensen | B60P 7/0815 |
| | | | 410/35 |
| 6,155,527 A | 12/2000 | Muyskens | |
| 6,220,562 B1 * | 4/2001 | Konkle | A47B 97/00 |
| | | | 248/500 |
| 6,276,285 B1 * | 8/2001 | Ruch | B65D 19/44 |
| | | | 248/346.03 |
| 6,460,820 B1 * | 10/2002 | Kopp | F16M 7/00 |
| | | | 248/500 |
| 6,514,021 B2 * | 2/2003 | Delay | B60P 7/0815 |
| | | | 410/104 |
| 6,524,040 B1 * | 2/2003 | Heil | B65D 19/0014 |
| | | | 410/100 |
| 6,651,454 B1 | 11/2003 | Spiegel | |
| 6,655,648 B2 | 12/2003 | Harris | |
| 6,712,567 B2 * | 3/2004 | Hsu | B60P 7/0815 |
| | | | 410/35 |
| 6,840,487 B2 | 1/2005 | Carnevali | |
| 7,175,149 B2 | 2/2007 | Gallien | |
| 7,185,871 B2 | 3/2007 | Orozco | |
| 7,334,421 B1 | 2/2008 | Cantolino | |
| 7,461,435 B2 * | 12/2008 | Brown | F24H 9/06 |
| | | | 24/200 |
| 7,819,068 B2 * | 10/2010 | Apps | B65D 19/004 |
| | | | 108/53.3 |
| 7,988,106 B2 | 8/2011 | Carnevali | |
| 8,074,952 B2 | 12/2011 | Baechle | |
| 8,418,632 B2 * | 4/2013 | Linares | B65D 19/0018 |
| | | | 108/55.1 |
| 8,640,632 B1 | 2/2014 | Odie | |
| 8,887,646 B2 * | 11/2014 | Skudutis | B32B 37/12 |
| | | | 108/56.3 |
| 8,959,822 B2 | 2/2015 | Kleppe | |
| 9,151,315 B2 | 10/2015 | McPheeters | |
| 9,309,025 B2 * | 4/2016 | Luis y Prado | B65D 19/44 |
| 9,676,514 B1 * | 6/2017 | Gamez | B65D 19/0069 |
| 9,809,146 B2 * | 11/2017 | Myers | B65D 90/0053 |
| 10,054,333 B1 * | 8/2018 | Colvin | F24F 13/32 |
| 10,408,493 B1 | 9/2019 | Carpenter | |
| 10,559,742 B1 * | 2/2020 | Sting | H01L 21/477 |
| 2002/0083660 A1 | 7/2002 | Oliver | |
| 2003/0075082 A1 * | 4/2003 | Apps | B65D 19/0012 |
| | | | 108/57.25 |
| 2005/0087665 A1 * | 4/2005 | Sutherland | B60R 7/02 |
| | | | 248/346.01 |
| 2006/0097123 A1 * | 5/2006 | Gallien | A47B 97/00 |
| | | | 248/500 |
| 2006/0201402 A1 * | 9/2006 | Moore, Jr. | B65D 19/0038 |
| | | | 108/57.25 |
| 2007/0029006 A1 | 2/2007 | Lampropoulos | |
| 2009/0291242 A1 * | 11/2009 | Owens, III | E04H 12/2246 |
| | | | 428/35.7 |
| 2010/0320360 A1 | 12/2010 | McLeod | |
| 2011/0061572 A1 | 3/2011 | Liu | |
| 2012/0106087 A1 | 5/2012 | Feller | |
| 2013/0211356 A1 * | 8/2013 | Nishikawa | A61F 13/55115 |
| | | | 604/365 |
| 2014/0277454 A1 * | 9/2014 | Locke | A61F 2/105 |
| | | | 623/15.12 |
| 2014/0296813 A1 * | 10/2014 | Riesinger | A61F 13/00017 |
| | | | 604/369 |
| 2015/0053839 A1 * | 2/2015 | Hubert | F16B 13/00 |
| | | | 248/507 |
| 2016/0355118 A1 * | 12/2016 | VanValkenburgh | B60P 7/0807 |
| 2018/0251278 A1 * | 9/2018 | Sasaki | A61J 1/10 |
| 2019/0093057 A1 * | 3/2019 | Tan | C11D 1/83 |
| 2019/0269548 A1 * | 9/2019 | Fan | C08L 33/26 |

* cited by examiner

MOUNTING PAD AND METHOD FOR DETERRING THEFT AND SECURING AIR CONDITIONING UNITS AGAINST HIGH WINDS

CROSS REFERENCE TO RELATED APPLICATIONS

This application is a continuation of prior U.S. patent application Ser. No. 15/685,283, filed Aug. 24, 2017, which is incorporated herein in its entirety. This application is related to prior U.S. patent application Ser. No. 16/563,388, filed on Sep. 6, 2019, which is a continuation of U.S. patent application Ser. No. 15/685,283, filed Aug. 24, 2017, each of which is incorporated herein in its entirety. This application is related to U.S. patent application Ser. No. 15/875,359, filed Jan. 22, 2018, now U.S. Pat. No. 10,408,493, issued Sep. 10, 2019; U.S. patent application Ser. No. 16/454,597, filed Jun. 27, 2019; and U.S. patent application Ser. No. 16/667,967, filed Oct. 30, 2019, each of which is incorporated herein in its entirety.

BACKGROUND AND SUMMARY OF THE INVENTION

The present invention relates to a support pad for the outdoor component of a split air conditioning (AC) system and installation method that not only raises the AC outside unit off the ground at least 4 inches as required by most building codes but that also secures that unit to prevent theft and further to secure the unit in high wind situations, such as hurricanes.

Typically, an AC pad is constructed of poured concrete formed in situ. This may be convenient in some cases, such as when other concrete work is being performed on site. However, an installer would find mixing or purchasing concrete specifically for this small application to be impractical, time consuming, or expensive.

As an alternative, prefabricated plastic and concrete pads are available for transport and placement on site. Available plastic pads, however, are typically lightweight and do not provide the required wind resistance once a AC unit is mounted on the pad. Similarly, preformed solid concrete pads are heavy and difficult to handle. Concrete pads with lightweight foam interiors such as the "The Hurricane Pad™" manufactured by DiversiTech (Duluth, Ga.) are somewhat fragile. As a result, these foam interior pads can be damaged, if dropped. In other cases, foam-cored pads are too light to secure an air conditioner in high winds.

A hurricane-wind rated AC pad must be able to keep the AC outdoor unit in place during high winds and also prevent the AC unit from toppling over or moving. The minimum necessary weight of the pad is dependent on the size and weight of the AC unit and the wind speed. Hurricane resistant AC pads must survive wind speeds up to 180 mph, with the actual required wind speed dependent on the location.

For example, Table 1 below provides the minimum weight necessary for a 36 inch×36 inch pad to secure various sizes and weights of AC units. The wind load is calculated from the methods presented in American Society of Civil Engineers (ASCE) Standard 7-16. The AC unit is an assumed to be a rigid structure and on flat ground in a moderately open area. The dimensions and weights of the AC units listed in Table 1 are based on actual commercially available outdoor units used in current split AC units and represent an example of the range of currently available actual AC outdoor units that could be mounted to such pads. Modern high efficiency AC outdoor units have become much taller, to allow greater heat exchanger area on the same footprint, and this has exacerbated the wind-driven tipping issue. For example, in Table 1, the Required Pad Weight has increased from 130 pounds for a 24×24×30-inch-high outdoor unit to 540 pounds for a 32×32×50 inch high outdoor unit. Building codes also require a minimum of a 2 inch border around the perimeter of any AC outdoor unit, so that a 32 inch base is the largest AC that can be placed on a 36 inch pad. Another common pad size is 42×42 inches, and by following the calculation procedures outlined in ASCE Standard 7-16, one skilled in the art could calculate the required weight to prevent tipping for any pad size and air conditioner geometry.

TABLE 1

Required AC unit pad weight to resist tipping.

| AC Unit Dimensions | | | | Required Pad Weight | |
|---|---|---|---|---|---|
| Width (in) | Length (in) | Height (in) | Weight (lb) | 150 mph Wind (lb) | 180 mph Wind (lb) |
| 24 | 24 | 30 | 100 | 59 | 130 |
| 24 | 24 | 35 | 120 | 97 | 193 |
| 26 | 26 | 30 | 120 | 53 | 129 |
| 26 | 26 | 35 | 140 | 95 | 199 |
| 28 | 28 | 30 | 140 | 46 | 128 |
| 28 | 28 | 35 | 160 | 93 | 205 |
| 28 | 28 | 40 | 190 | 141 | 286 |
| 30 | 30 | 30 | 160 | 39 | 127 |
| 30 | 30 | 35 | 190 | 81 | 201 |
| 30 | 30 | 40 | 220 | 134 | 290 |
| 30 | 30 | 45 | 240 | 208 | 406 |
| 32 | 32 | 35 | 220 | 69 | 197 |
| 32 | 32 | 40 | 250 | 128 | 294 |
| 32 | 32 | 45 | 280 | 198 | 409 |
| 32 | 32 | 50 | 310 | 281 | 540 |

Table 1 makes clear that a concrete pad would need to be quite heavy to prevent tipping due to the moment caused by wind, making it very difficult to carry one into place at the installation site.

One known approach proposed the use of a hollow pad with a hollow interior chamber filled with sand, other granular materials, or water so as to achieve the necessary weight required to prevent the pad from tipping in the case of hurricane winds. With water, the pad was not intended to be completely filled so that in colder climates, the expansion of frozen water would not damage the pad. Even if such a pad were completely filled with water and a height increased to 6 inches, for certain tall outdoor AC unit geometries, the water alone would not provide sufficient weight to keep the pad in place in the highest possible winds, such as 180 mph winds. Another way to secure the pad such as the use of higher density materials inside the hollow pad, such as the use of sand, are known in the art. At least one central support has also been proposed to prevent sagging, but that would limit the ability of a granular material like sand to completely fill the hollow core and reduce the fill volume and therefor the weight of the filled pad. If the central support is large, it can significantly reduce the volume of fill material available for weighing the pad down.

One of the objects of our invention is to provide an easily transportable, lightweight, rugged, and low-cost AC pad and installation method that, once located and leveled on site, can be secured to prevent theft and tipping, even in high wind loads. Our novel AC pad can be configured as a hollow plastic shell that can be rotationally molded to reduce cost and minimize weight. If the pad is formed by conventional rotational molding, the molded pad will typically be formed from one of a variety of thermoformed plastics. The currently preferred embodiment uses a linear low-density polyethylene (LLDPE) to form a rigid structure with uniform wall thickness. However, any thermoform-capable material such as low density polyethylene (LDPE), medium density polyethylene (HDPE), high density polyethylene (HDPE), cross linked polyethylene (XLPE), nylon, polypropylene, and polyvinyl chloride (PVC) are acceptable alternatives. While the currently preferred material wall thickness for the pad is 0.2 inches throughout the pad, alternative embodiments can use material thicknesses from 0.1 inches to 0.75 inches with, if desired to reduce costs, non-uniform wall thickness by using well known shielding on the rotational mold to adjust cooling times and thereby obtain non-uniform wall thicknesses. For example, the side-walls could be 0.1 inches, the top AC bearing surface 0.5 inches and the bottom soil facing surface 0.2 inches. Of course, support structures can be used to ensure sufficient support without the need to thicken an entire surface. As pointed out herein, these support structures can also serve as adjustable securing locations for tie-down straps.

Once located and leveled, the empty shell that contains a gelling formulation of known composition according to our invention can be filled with water and sealed, and securing straps installed in the pad before the AC outdoor unit is located on the pad can be attached to the AC unit to secure the unit to the pad. The filling water is converted to a solidus or gel state due to the gelling formulation already present inside the empty pad structure. The gel/solidus conversion will be used to prevent weight loss, even if the leak-tight seal is compromised. Additionally, if a super absorbent polymer (SAP), such as sodium polyacrylate, sodium polycarbonate, polyacrylamide copolymers, ethylene maleic anhydride, carboxymethylcellulose, polyvinyl alcohol copolymers, or polyethylene oxide, is used in the gelling compound formulation, then the resulting mixture will not expand upon freezing, thereby allowing the pad to be completely filled with water, with the added benefit of avoiding the need for an expansion void space. Filling the interior volume completely with the gelled water also allows the filling mixture to provide support to the pad, thereby serving to prevent deformation and avoiding the need for any internal structure, since the required support to prevent deflection can be supplied by the filled interior volume of the entire pad. This novel approach provides a uniform support and avoids any localized deflections in regions distant from a central support if a central support is used.

In the event the AC pad according to our invention were increased to heights above 4 inches and arguably, when filled, may still not be considered to provide sufficient weight to prevent tipping in the highest wind conditions, anchors can be screwed or driven into the soil in order to add additional tipping resistance.

Our novel AC pad will connect to the outdoor AC unit through easily adjustable securing straps that, once installed though the bottom of the pad, cannot be removed without first lifting the air conditioning unit and pad. Of course, lifting the pad is much more difficult after the pad is secured to the underlying soil and filled with water. The securing straps are installed through slots open to the bottom of the AC pad and connected directly to the AC unit. The straps are able to rotate and move to accommodate various sizes and shapes of AC units. Additionally, extra slots and slots at various slot angles can be made available for use without departing from the scope of our invention.

In addition, theft of the AC unit will be deterred because of the combined weight of the AC pad and the AC outdoor unit, and if used, the lifting strength of the anchors driven into the ground. Moreover, our invention contemplates that the AC outdoor unit can be connected to the AC pad with known types of anti-theft fasteners, such as machine or sheet metal screws with unique heads that can only be unscrewed with a special tool. An anti-theft cable can also be installed. Similar to the securing straps, the anti-theft cable connects to the pad using one of the unused slots and is installed though the bottom of the pad (before the pad is secured in place). Like the securing straps, the cable cannot be removed without first lifting the pad. The other end of the anti-theft strap is connected to some portion of the AC outdoor unit using anti-theft fasteners, similar to those used for the straps.

BRIEF DESCRIPTION OF THE DRAWINGS

These and further features, objects, and advantages of the present invention will become more readily apparent from the following detailed description when taken in conjunction with the accompanying drawings wherein.

DETAILED DESCRIPTION OF THE DRAWINGS

Figure 1:
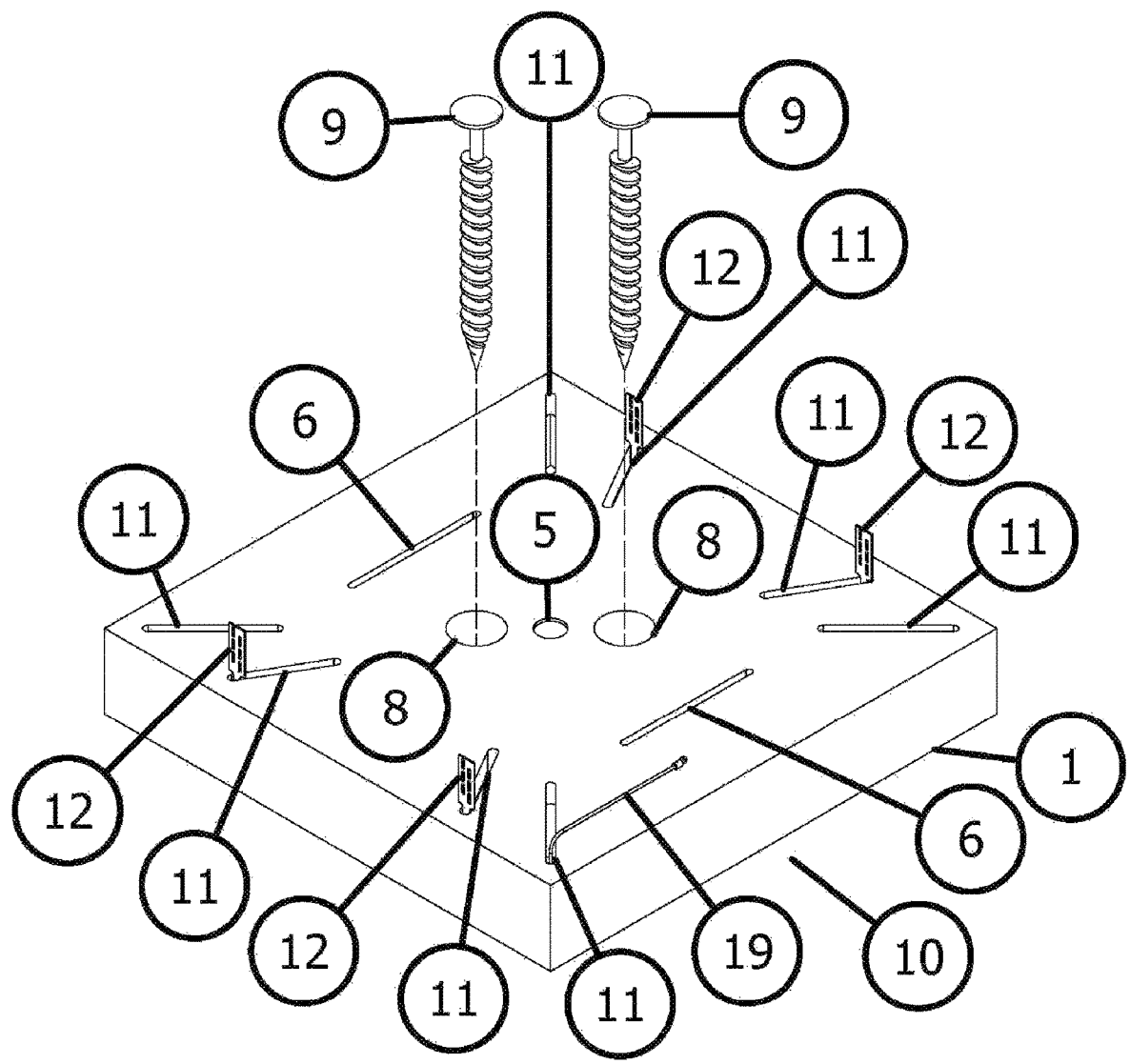
FIG. 1 is a perspective view of a currently preferred embodiment of the AC pad according to the present invention.

Referring now to FIG. 1, an AC securing system 100, is shown where a hollow AC pad 1 of approximately square or rectangular configuration and possibly rounded corners has eight securing slots 11 that can accommodate a desired number of securing straps 12. In a currently preferred embodiment, the straps 12 can be slid inwardly and outwardly, and can also be rotated tangentially to the AC unit 2 (FIG. 2) and thereby conform to a wide variety of AC outdoor unit sizes and shapes. That is, the straps 12 are able to slide inwardly and outwardly to adapt to the length and width of the AC outdoor unit 2. Once the straps 12 are installed into the pad 1 from the bottom of the pad (FIG. 5), they cannot be removed from the pad 1 without extreme difficulty. It is currently contemplated that only four securing straps 12 would be necessary for any one installation; however, eight location slots 11 are shown to provide design flexibility. The slots can be tapered or have a recess 17 (FIG. 5) to allow the associated securing strap 12 to slide inwardly or outwardly without being restrained by the soil 10 the pad has been placed against.

Figure 2:
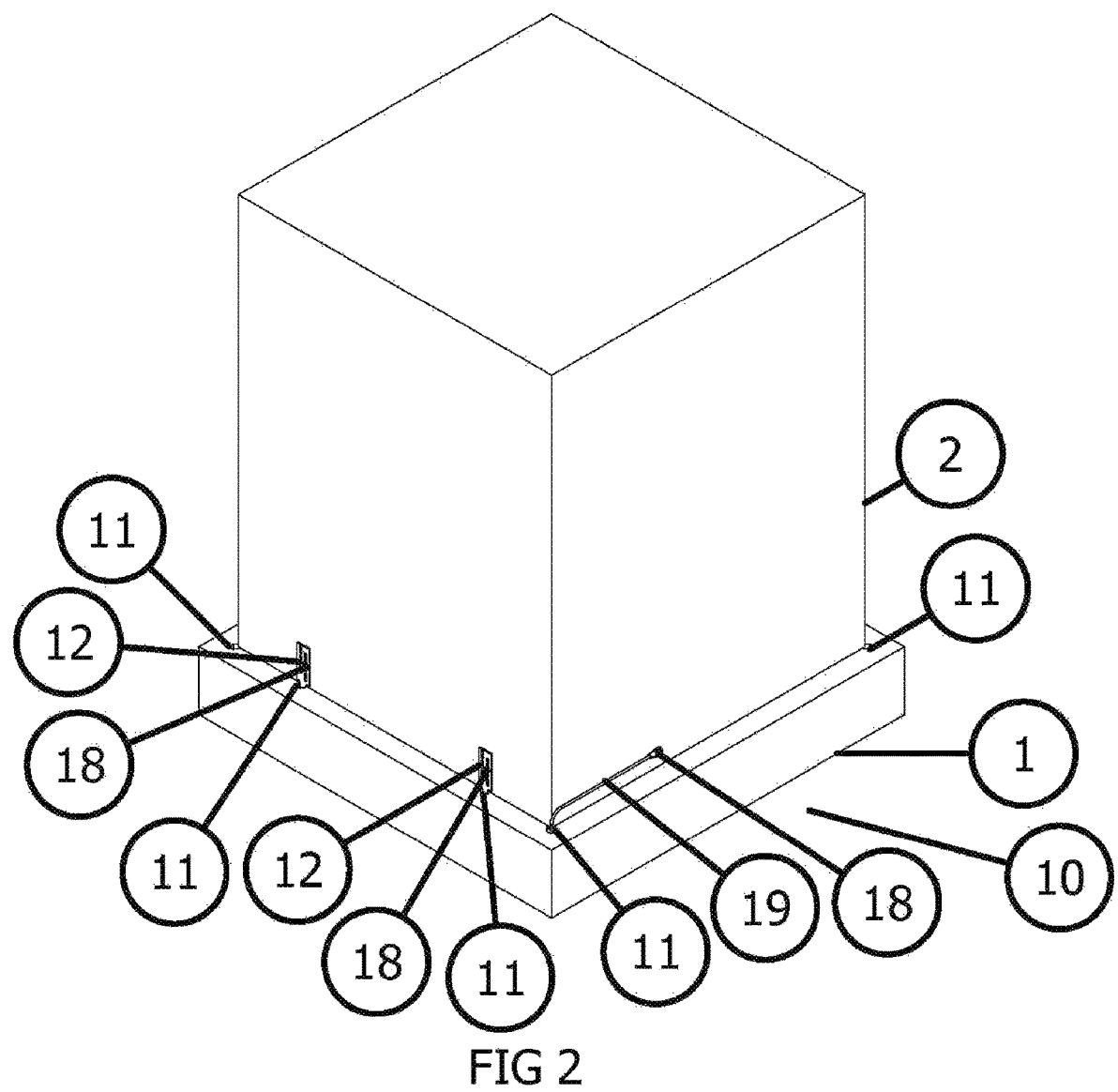
FIG. 2 is a perspective view of the AC pad shown in FIG. 1, with an AC outdoor unit secured to the pad.
Figure 9:
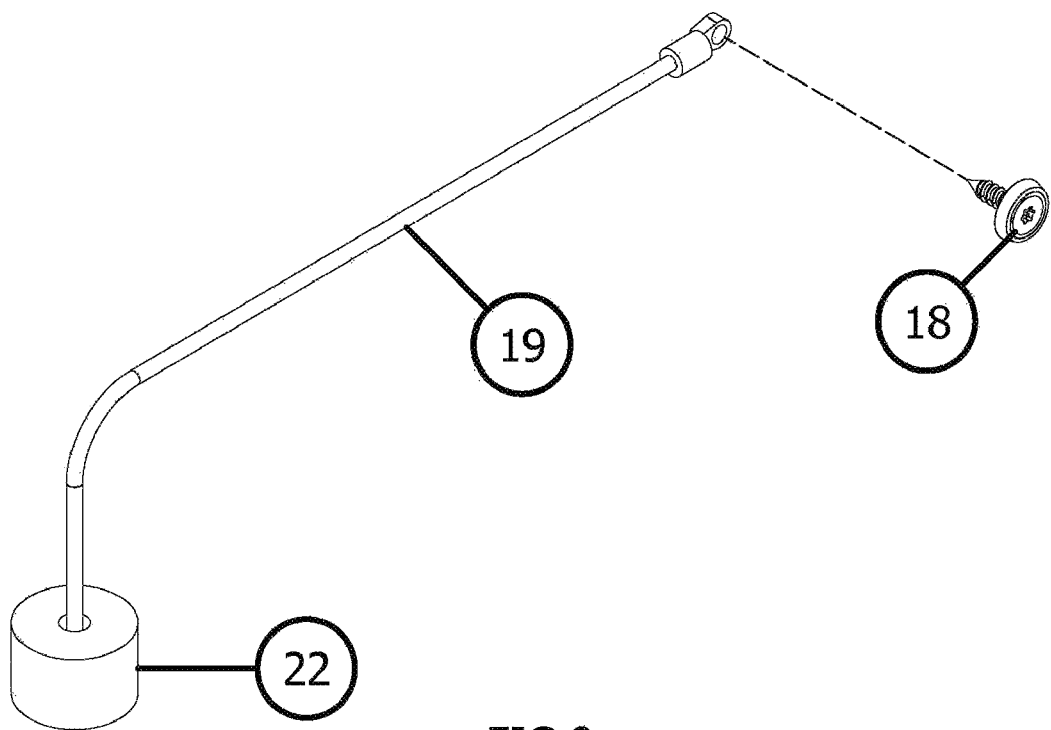
FIG. 9 is a perspective view of a currently preferred embodiment of an anti-theft security cable for the AC pad of FIG. 1.
Figure 10:
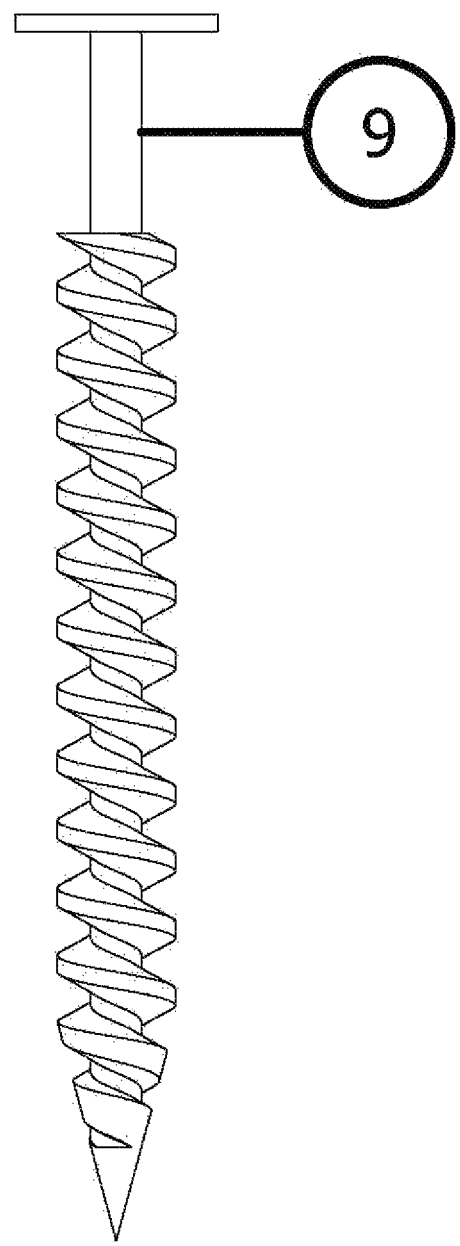
FIG. 10 is a side view on one contemplated securing anchor for the AC pad of FIG. 1.

The currently preferred embodiment can also contain one or more optional securing anchors 9 that are secured to the soil 10 (two are shown in FIG. 1) through by-pass holes 7 having recesses 8 at the pad's upper surface so that the anchors 9, one embodiment of which is shown in FIG. 10, will be screwed or driven into the ground after the securing straps 12 and anti-theft strap 19 of the type shown in FIG. 9 (if used) are installed into the pad 1 and the pad has been located at the desired location and leveled. Because of the central location of the by-pass holes 7 inside the footprint of the unit 2, the anchors 9 will not be accessible after the AC unit 2 is installed as seen in FIG. 2. Although the strap securing slots 11 will also serve as central supporting structures in most applications, additional supporting structures 6 can also be utilized if desired. Once the pad 1 is filled completely with water (i.e., filled before the AC outdoor unit 2 is located on the pad), the pad will also be supported by the interior fill volume. The filling port 5 for the pad is located under the footprint of the AC outdoor unit 2, which in the currently preferred embodiment, is near the center of the pad 1. The port 5 is specifically located to be hidden from access or view once the AC unit 2 is secured on the pad 1. The anti-theft cable 19 is installed in one of the unused location slots 11 so that, when inserted from the bottom of the pad 1 through one of the slots 11 and connected with anti-theft fasteners 18 of generally known construction to the AC unit 2, the cable 19 will become restrained to the pad 1.

FIG. 2. is a perspective view of the AC pad 1 of FIG. 1, with an AC outdoor unit 2 secured to the top of the pad 1. The AC unit 2 is sized so that there is at least 2 inches of the pad 1 around the exterior that is not covered as may be required by building codes. As shown, the anchors 9 and fill port 5 shown in FIG. 1 are completely covered when the unit 2 has been installed.

Figure 3:
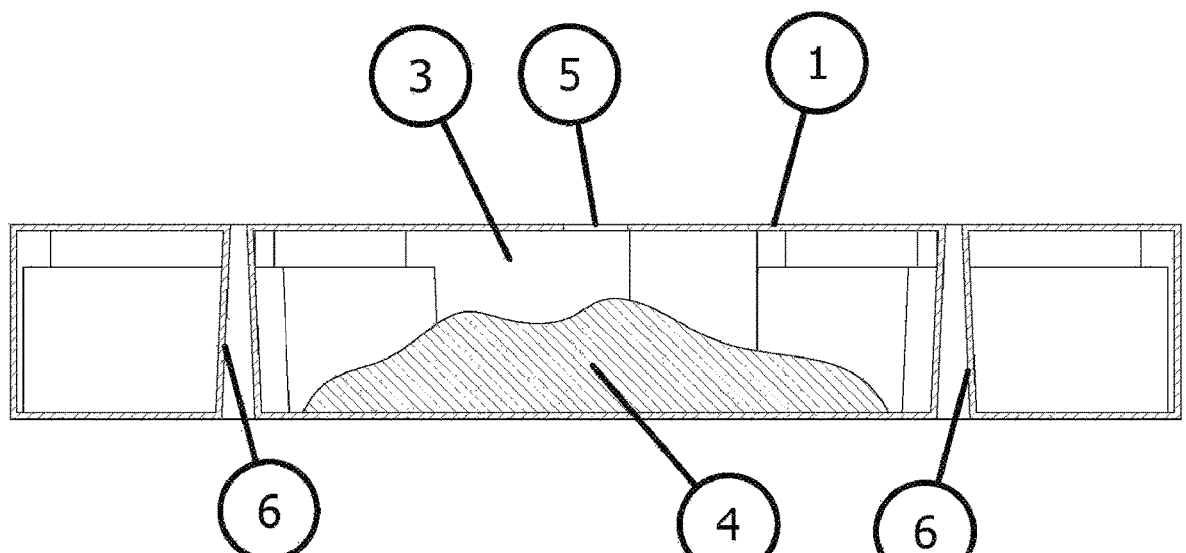
FIG. 3 is a side sectional view of the currently preferred embodiment of the AC pad shown in FIG. 1.

FIG. 3 is a side sectional view of the AC pad 1 and shows that the AC pad has a hollow interior region 3 that will be filled with water and sealed when installed. The hollow region 3 will also have a super absorbent polymer material 4 that will combine with the water and form a gel or solidus media filling the interior volume 3 to prevent leakage if the seal integrity is compromised. As above noted, the shell can be provided with optional support structures 6 to prevent sagging. It will be understood, of course, that the slots 11 for the securing straps 12 will themselves also provide support.

Figure 4:
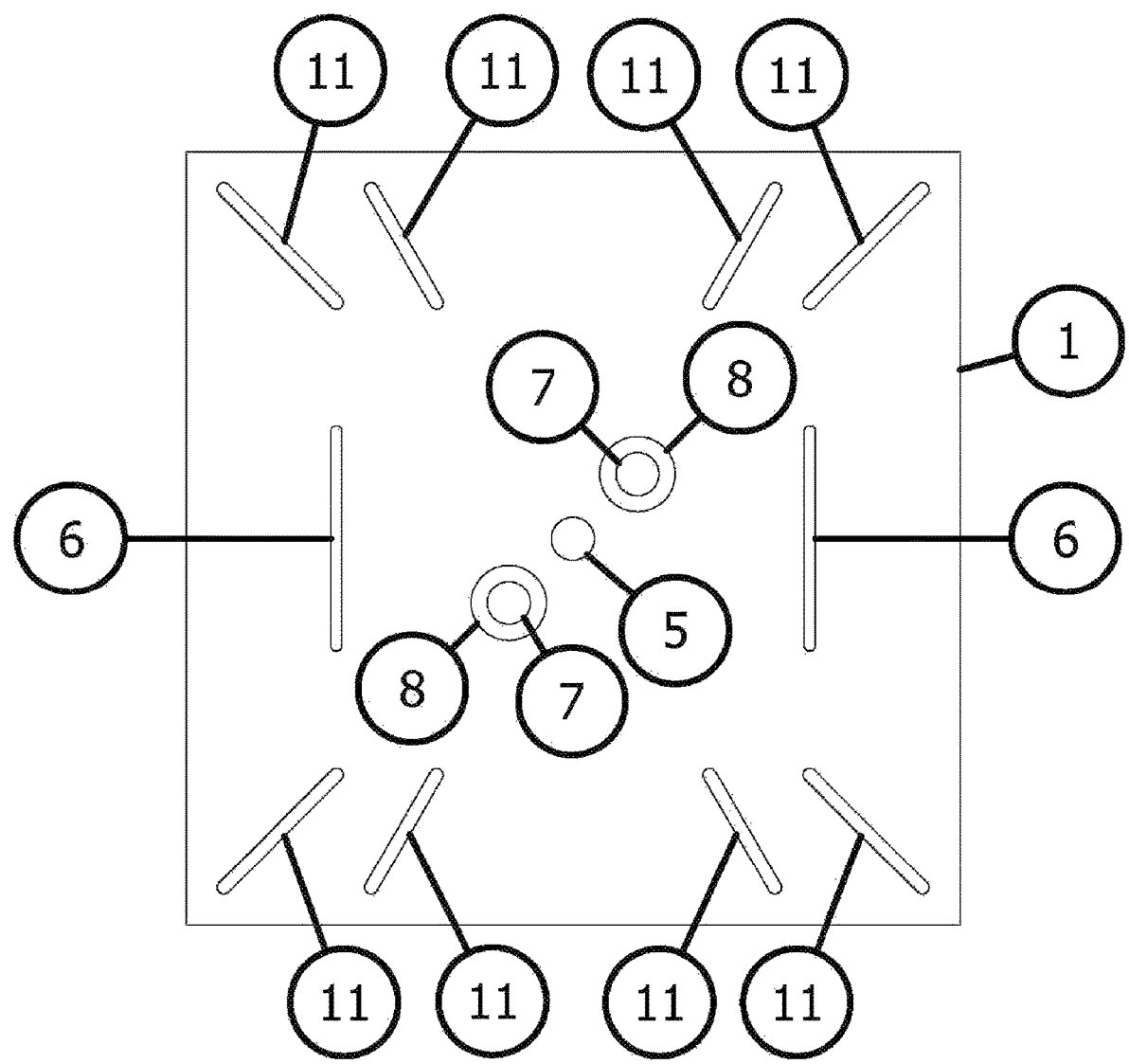
FIG. 4 is a top view of the AC pad shown in FIG. 1.

FIG. 4 is a top view of the AC pad 1 showing the holes 7 for the anchors 9, eight slots 11 for the straps 12 that are used to secure the AC unit 2 to the pad 1 and prevent any movement of the AC unit on the pad. The holes 7 have a recess 8 so that the anchors, once installed, will be recessed into the surface of the pad allowing the AC outdoor unit 2 to sit flat on the pad.

Figure 5:
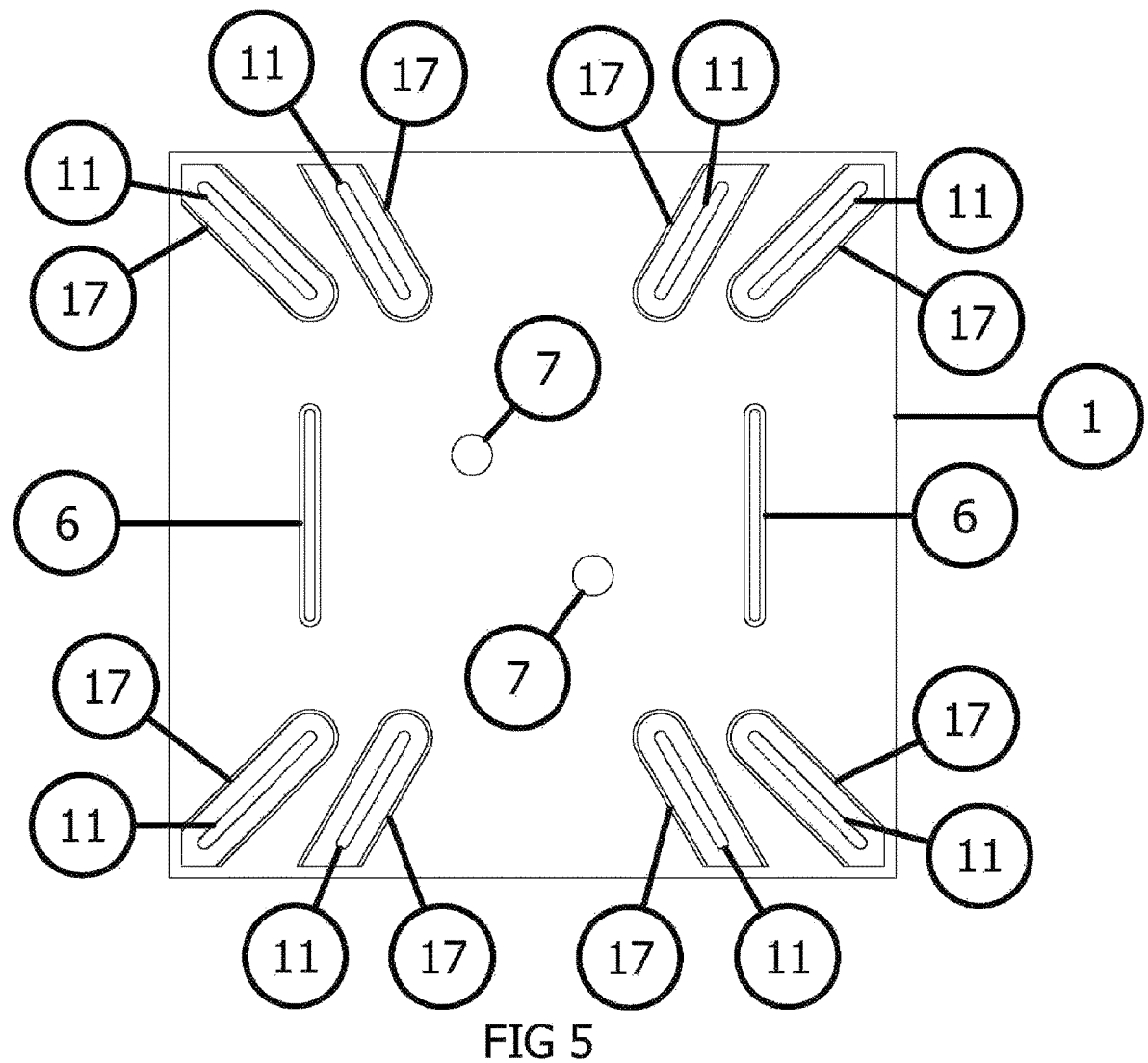
FIG. 5 is a bottom view of the AC pad shown in FIG. 1.

FIG. 5 is a bottom view of the AC pad 1. The recess 17 surrounding the slots 11 provide space for the securing straps 12 or optional anti-theft cable 19 to be adjusted without resistance from the soil 10 that could potentially impede motion. The support structures 6 that are used to prevent deflection of the pad due to the weight of the AC outdoor unit 2 can also be configured with a recess 17' to also function similar to the slots 11 and recesses 17 so that they can accommodate the straps 12 or anti-theft cable 19. The centrally located pass-thru holes 7 for the anchors 9 are also shown.

Figure 6:
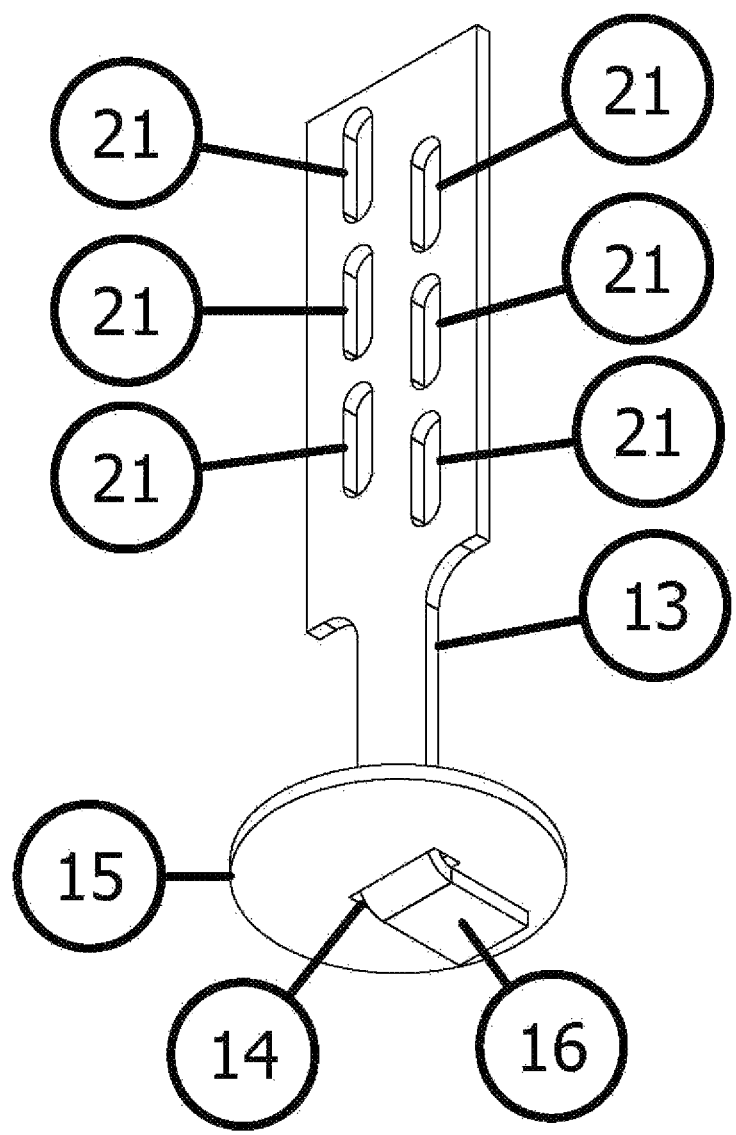
FIG. 6 is a perspective view of one embodiment of an adjustable securing strap usable with the AC pad of the present invention.

FIG. 6 shows a currently preferred embodiment of one of the adjustable securing straps 12. In this configuration, the securing portion 13 will be inserted into the slot 14 in the rigid circular base 15, bent and spot welded 16 to form a permanent connection. This securing strap 12 will be installable from the bottom of the pad 1. The straps will not be removable from the pad once the pad is on the ground. Known types of anti-theft fasteners 18 can also be used to secure the straps 12, by passing the fasteners through apertures 21, to the AC unit 2. The circular base 15 of FIG. 6 or 15' of FIG. 7 used for the securing strap assembly 12 and 12' and the circular base 15" used the anti-theft assembly 19 (shown in FIG. 9) are configured to be circular so that the strap or cable can rotate in the slot 14 and in the case of the strap, allow the securing portion of the strap 13 to lay flat (be tangent) against the surface of the AC unit 2 where it is located.

Figure 7:
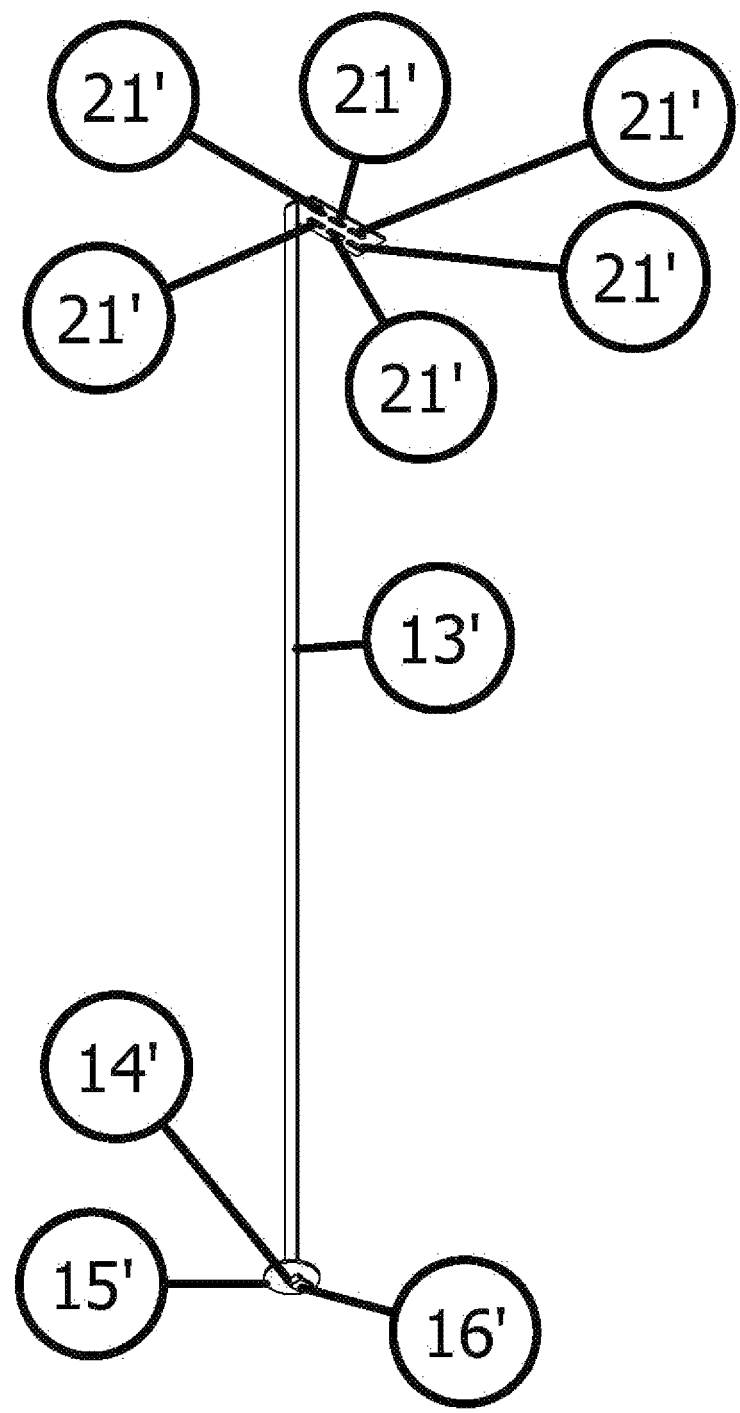
FIG. 7 is a perspective view of another embodiment of the adjustable securing strap.
Figure 8:
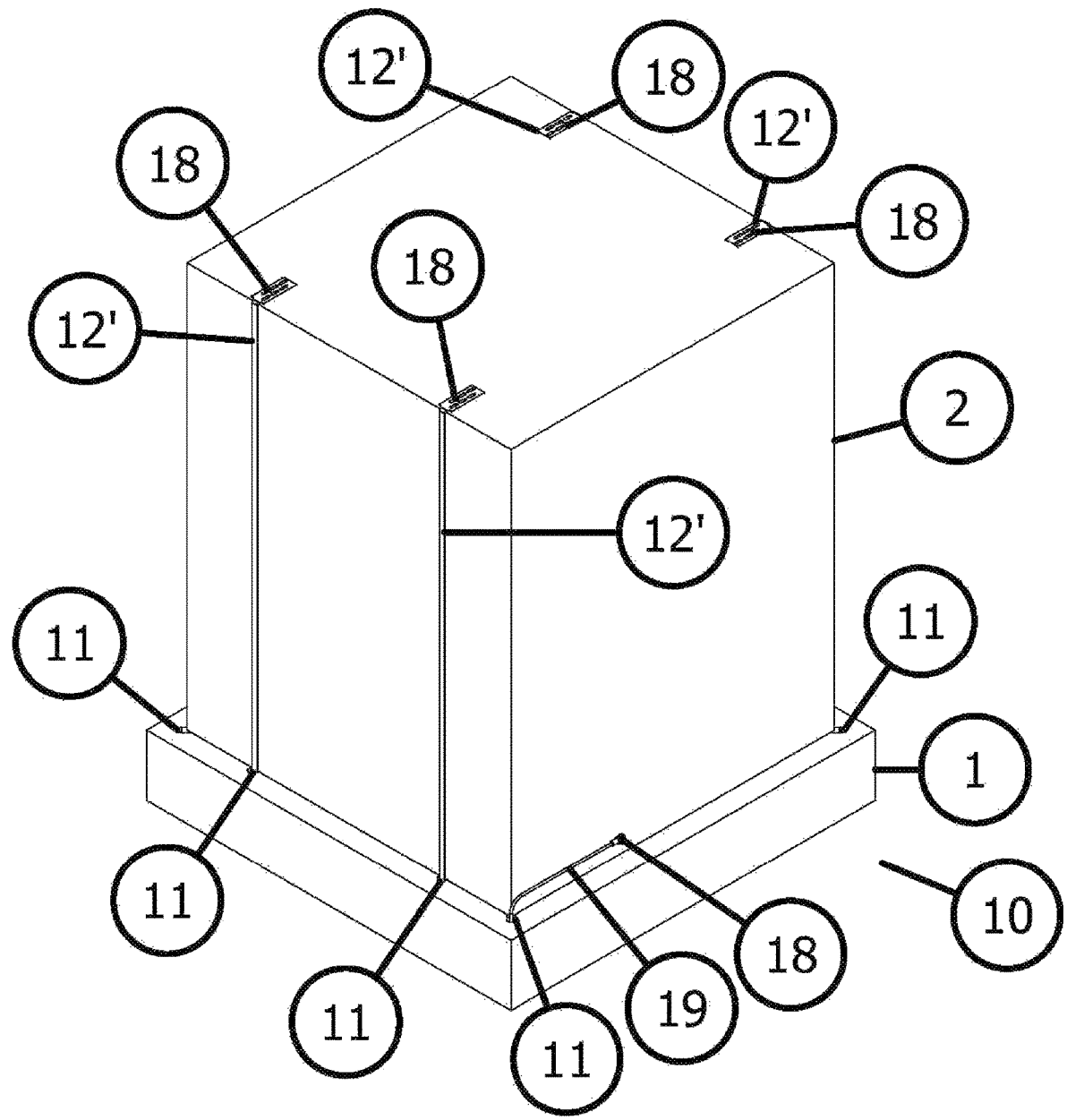
FIG. 8 is a perspective view of the AC pad of FIG. 1, with an AC unit secured to the pad using the securing straps of FIG. 7.

FIG. 7 is an alternate embodiment of an adjustable securing strap 12'. In this configuration, the securing portion 13' will be inserted into the slot 14' in the base 15', bent and spot welded 16' to form a permanent connection. Like the embodiment of FIG. 6, the securing strap 12' will be installable from the bottom of the pad 1 so as not to be removable from the pad 1 once the pad is on the ground. Anti-theft fasteners can also be used to secure the straps to the AC unit 2. As shown in FIG. 8, the security straps 12' will extend the securing portion of the strap 13' to the top of the AC unit 2 in order to further deter theft. This embodiment can also use anti-theft fasteners 18 connected to the top of the AC unit 2 to prevent opening of the unit.

FIG. 9 is an embodiment of the anti-theft cable 19 shown installed in FIGS. 2 and 8. This cable has a restraining feature 15" that, when inserted from the bottom of the pad 1 through one of the slots 11 or central support structures 6 and connected with anti-theft fasteners 18 to the AC unit 2, it will become restrained to the pad 1 as shown in FIGS. 2 and 8.

FIG. 10 is an embodiment of the securing anchor 9 shown in FIG. 1. This anchor is driven or screwed into the soil to further secure the pad 1 to the underlying soil (10 in FIG. 1).

While we have shown and described our invention above, it should be understood that the same is susceptible to changes and modifications that will now be apparent to one skilled in the art. Therefore, we do not intend to be limited to the details shown and described herein but contemplate that all such changes and modifications will be covered to the extent encompassed by the appended claims.

We claim:

1. A kit for securing a plurality of different sized air conditioning outdoor units, comprising:
   a hollow shell, wherein the hollow shell is provided with a plurality of securing slots arranged to permit the securing of at least one of the different sized air conditioning outdoor units and wherein the plurality of securing slots extend from an underside surface of the hollow shell to an upperside surface of the hollow shell to form openings through the hollow shell;
   a plurality of securing straps that are configured to be adjustable, the securing straps each having a base sized to fit within an associated one of the securing slots and the securing straps each having at least one aperture and a securing portion of the securing strap that passes through the securing slot;
   wherein the arrangement of the securing slots permits at least one of the plurality of securing straps to slide inwardly and outwardly with respect to the underside surface and the upperside surface of the hollow shell; and
   a plurality of headed fasteners to secure the securing straps into the outdoor unit through at least one aperture in the strap.

2. The kit of claim 1, further comprising:
at least one anchor to secure the hollow shell to a surface.

3. The kit of claim 1, wherein the hollow shell contains a gelling material.

4. The kit of claim 1, wherein the super absorbent polymer material is selected from the group comprised of sodium polyacrylate, sodium polycarbonate, polyacrylamide copolymers, ethylene maleic anhydride, carboxymethylcellulose, polyvinyl alcohol copolymers, and polyethylene oxide.

5. The kit of claim 3, wherein the gelling material comprises a super absorbent polymer material.

\* \* \* \* \*